(12) United States Patent
Yang et al.

(10) Patent No.: US 11,686,782 B2
(45) Date of Patent: Jun. 27, 2023

(54) APPARATUS FOR FAILURE PREDICTION OF POWER CABLE AND METHOD THEREOF

(71) Applicant: HYUNDAI MOBIS CO., LTD., Seoul (KR)

(72) Inventors: Hae Jun Yang, Yongin-si (KR); Sang Han Lee, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/524,317

(22) Filed: Nov. 11, 2021

(65) Prior Publication Data

US 2022/0170998 A1     Jun. 2, 2022

(30) Foreign Application Priority Data

Dec. 1, 2020   (KR) ........................ 10-2020-0166073

(51) Int. Cl.
*G01R 31/58*     (2020.01)
*G01R 31/54*     (2020.01)

(52) U.S. Cl.
CPC ............. *G01R 31/58* (2020.01); *G01R 31/54* (2020.01)

(58) Field of Classification Search
CPC ... G01R 31/58; G01R 31/54; B60W 50/0205; B60W 40/02; B60W 2050/021; B60W 2555/20; B60Y 2306/15; B60Y 2400/302
See application file for complete search history.

(56) References Cited

U.S. PATENT DOCUMENTS

2020/0158772 A1\*  5/2020  Du ........................ B60L 3/0084

FOREIGN PATENT DOCUMENTS

| CN | 112213668 A | \* | 1/2021 |
| KR | 20150118307 A | \* | 10/2015 |
| KR | 10-1601405 B1 | | 3/2016 |

\* cited by examiner

*Primary Examiner* — Christopher E Mahoney
(74) *Attorney, Agent, or Firm* — NSIP Law

(57) ABSTRACT

A power cable failure prediction apparatus and method includes a temperature sensor configured to measure a temperature around a vehicle, a resistance measurer configured to measure a resistance of a cable connected to a drive motor of the vehicle, and a controller configured to predict in advance whether the cable is damaged by comparing the temperature around the vehicle with the resistance of the cable.

6 Claims, 3 Drawing Sheets

APPARATUS FOR FAILURE PREDICTION OF POWER CABLE AND METHOD THEREOF

CROSS-REFERENCE TO RELATED APPLICATION

This application claims the benefit under 35 USC § 119(a) of Korean Patent Application No. 10-2020-0166073, filed in the Korean Intellectual Property Office on Dec. 1, 2020, the entire contents of which are incorporated herein by reference for all purposes.

BACKGROUND

1. Field

The present disclosure relates to an apparatus for a failure prediction of a power cable and a method thereof, and more particularly, relates to a power cable failure prediction apparatus capable of determining in advance whether a power cable is damaged in a drive motor that directly drives a vehicle wheel and method thereof.

2. Discussion of Related Art

In a vehicle equipped with a drive motor system, in an in-wheel drive motor, due to vertical movement of a suspension or left and right operation of a steering device, a cable may be damaged as a stress concentration phenomenon occurs in the cable that transfers a power to a motor.

Such an in-wheel drive motor system has a high possibility of cable damage because it is placed on the vehicle wheel and exposed to an external environment, when a fatigue (stress concentration) endurance occurs continuously from starting with some damage to a conductor in the cable, finally disconnection failure occurs.

However, since the prior art determines whether a failure is detected by detecting a three-phase cable disconnection failure, it is difficult to adequately determine an occurrence of some damage in the cable.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a power cable failure prediction apparatus including a temperature sensor configured to measure a temperature around a vehicle, a resistance measurer configured to measure a resistance of a cable connected to a drive motor of the vehicle, and a controller configured to predict in advance whether the cable is damaged by comparing the temperature around the vehicle with the resistance of the cable.

The resistance measurer may be configured to measure a resistance of a braid constituting the cable.

The controller may be configured to determine that the cable is damaged, in response to a rate of change in the resistance of the cable being greater than a rate of change in the temperature around the vehicle.

The controller may be configured to measure the temperature around the vehicle and the resistance of the braid before the vehicle is driven, to measure the temperature around the vehicle and the resistance of the braid while the vehicle is driving, and to determine that the braid is damaged, in response to a rate of change in the resistance of the braid being greater than a rate of change in the temperature around the vehicle.

The controller may be configured to display an alarm, in response to determining that the braid is damaged.

In another general aspect, there is provided a method of predicting a failure of a power cable, the method including measuring a temperature around a vehicle, measuring a resistance of a cable connected to a drive motor of the vehicle, and predicting in advance whether the cable is damaged by comparing the temperature around the vehicle with the resistance of the cable.

The measuring of the resistance of the cable connected to the drive motor of the vehicle may include measuring a resistance of a braid constituting the cable.

The predicting in advance of whether the cable is damaged by comparing the temperature around the vehicle with the resistance of the cable may include determining that the cable is damaged, in response to a rate of change in the resistance of the cable being greater than a rate of change in the temperature around the vehicle.

The predicting in advance of whether the cable is damaged by comparing the temperature around the vehicle with the resistance of the cable may include measuring the temperature around the vehicle and the resistance of the braid before the vehicle is driven, measuring the temperature around the vehicle and the resistance of the braid while the vehicle is driving, and determining that the braid is damaged in response to a rate of change in the resistance of the braid being greater than a rate of change in the temperature around the vehicle.

The method may include displaying an alarm, in response to determining that the braid is damaged.

Other features and aspects will be apparent from the following detailed description, the drawings, and the claims.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In describing the components of the embodiment according to the present disclosure, terms such as first, second, "A", "B", (a), (b), and the like may be used. These terms are merely intended to distinguish one component from another component, and the terms do not limit the nature, sequence or order of the constituent components. Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the present disclosure will be described in detail with reference to FIGS. 1 and 2.

Figure 1:
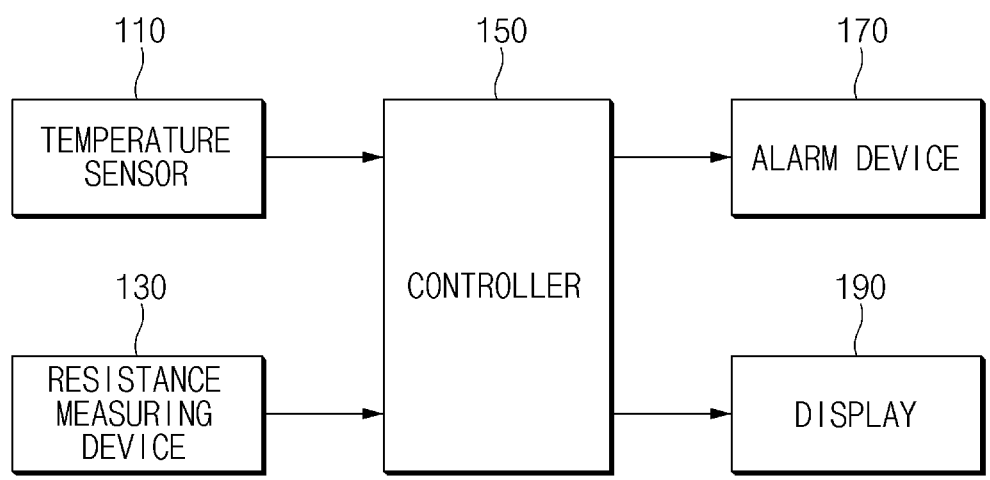
FIG. 1 is a block diagram illustrating a power cable failure prediction apparatus according to an embodiment of the present disclosure.
Figure 2:
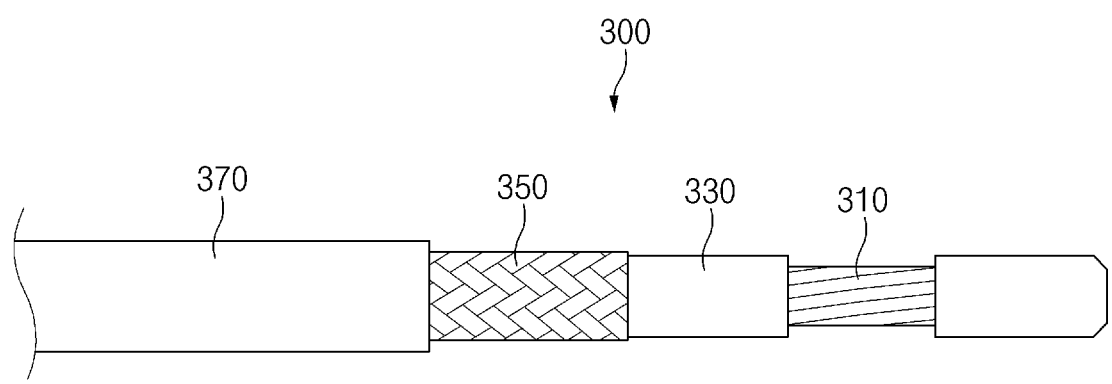
FIG. 2 is a diagram illustrating a power cable which is a measurement target of a power cable failure prediction apparatus according to an embodiment of the present disclosure.

FIG. 1 is a block diagram illustrating a power cable failure prediction apparatus according to an embodiment of the present disclosure, and FIG. 2 is a diagram illustrating a power cable which is a measurement target of a power cable failure prediction apparatus according to an embodiment of the present disclosure.

The present disclosure is to ensure a safe operation of a vehicle by predicting in advance a damage of a power cable 300 that supplies a power to a drive motor when a cable braid (a shield cable) is damaged in a vehicle equipped with a power system (drive motor) that directly drives wheels of the vehicle.

In detail, the braid is used for cable grounding (noise improvement), and is affected first when a disconnection of the power cable occurs due to stress concentration.

Therefore, the present disclosure has an object to predict a failure of the vehicle in advance by predicting the damage of the power cable 300 in advance by detecting the damage or disconnection of the braid before the damage or disconnection of the power cable 300 occurs, rather than by detecting the disconnection of the power cable 300 that supplies a power to the drive motor of the vehicle.

Referring to FIG. 1, a power cable failure prediction apparatus according to an embodiment of the present disclosure may include a temperature sensor 110, a resistance measuring device 130 (may also be referred to as a resistance measurer), a controller 150, an alarm device 170 (may also be referred to as an alarm), and a display 190.

The temperature sensor 110 may be mounted on a vehicle to measure a temperature around the vehicle.

The drive motor of the vehicle may be provided on the left wheel and the right wheel of the vehicle, respectively, and may receive a three-phase driving current through the power cable 300 through an inverter to transfer a driving force to the left wheel and the right wheel, respectively.

The power cable 300 may include a conductor 310, an isolator 330, a braid 350, and a sheath 370, as illustrated through FIG. 2.

The conductor 310 is a metal part connected to the drive motor to flow a current, and may be composed of copper, aluminum, or the like.

The isolator 330 covers the conductor 310 to withstand a used voltage, serves to fix a position of the conductor 310, and may be composed of a PVC (Polyvinyl Chloride) material, an SR-PVC (Semi Rigid PVC) material, a PE (Poly Ethylene) material, or the like.

The braid 350 forms a shielding layer for blocking an influence of an electric or magnetic field, and may be made by weaving a copper wire or the like in a mesh shape.

To increase a shielding effect, the braid 350 may be configured to be wrapped with an Al-Mylar tape.

The sheath 370 may be made of a plastics material, and may protect the isolator 330, the conductor 310, and the like by covering the braid 350.

The resistance measuring device 130 is provided in the inverter so as to measure the resistance of the power cable 300, may determine the ground state of the power cable 300 as a resistance.

The resistance measuring device 130 may measure the resistance of the braid 350 constituting the power cable 300.

Since the braid 350 is a state in which copper wires are composed of several strands, when a part of the copper wires constituting the braid 350 is damaged, compared to when the copper wires are not damaged, a change in a resistance value may occur.

For reference, the reason for measuring the resistance of the braid 350 without measuring the resistance of the conductor 310 through the resistance measuring device 130 is that the number of copper wires constituting the braid 350 is significantly less than the number of copper wires constituting the conductor 310.

For example, assuming that there are 100 copper wires constituting the conductor 310 and 10 copper wires constituting the braid 350, when one of 100 copper wires constituting the conductor 310 is damaged, it corresponds to a 1% change. However, when one of the 10 copper wires constituting the braid 350 is damaged, it corresponds to a 10% change. Therefore, in detecting an amount of change in the resistance value, a damage detection of the braid 350 may be relatively advantageous.

The controller 150 may predict in advance whether the power cable 300 is damaged by comparing the temperature around the vehicle with the resistance of the power cable 300, and may provide an alarm regarding a damage of the power cable 300 to the driver through the alarm device 170 and the display 190 provided inside the vehicle.

Before the driving is started after the vehicle is started, the controller 150 may obtain a reference temperature by measuring a temperature around the vehicle through the temperature sensor 110, and may obtain a reference resistance value by measuring a resistance of the braid 350 through the resistance measuring device 130.

Subsequently, when the drive motor is operated and the vehicle is driving, the controller 150 may obtain an operation resistance value by measuring a resistance of the braid 350 through the resistance measuring device 130, and may obtain an operation temperature by measuring a temperature around the vehicle through the temperature sensor 110 when the operation resistance value is greater than the reference resistance value.

Subsequently, the controller 150 may compare a rate of change of temperature based on a difference between the reference temperature and the operation temperature with a rate of change of resistance based on a difference between the reference resistance value and the operation resistance value, and when the rate of change of resistance is greater than the rate of change of temperature, the controller 150 may determine that the braid 350 is damaged.

Subsequently, the controller 150 may generate the alarm regarding the damage of the braid 350 through the alarm device 170, and may output a message regarding a vehicle inspection through the display 190.

Hereinafter, a power cable failure prediction method according to another embodiment of the present disclosure will be described in detail with reference to FIG. 3.

Figure 3:
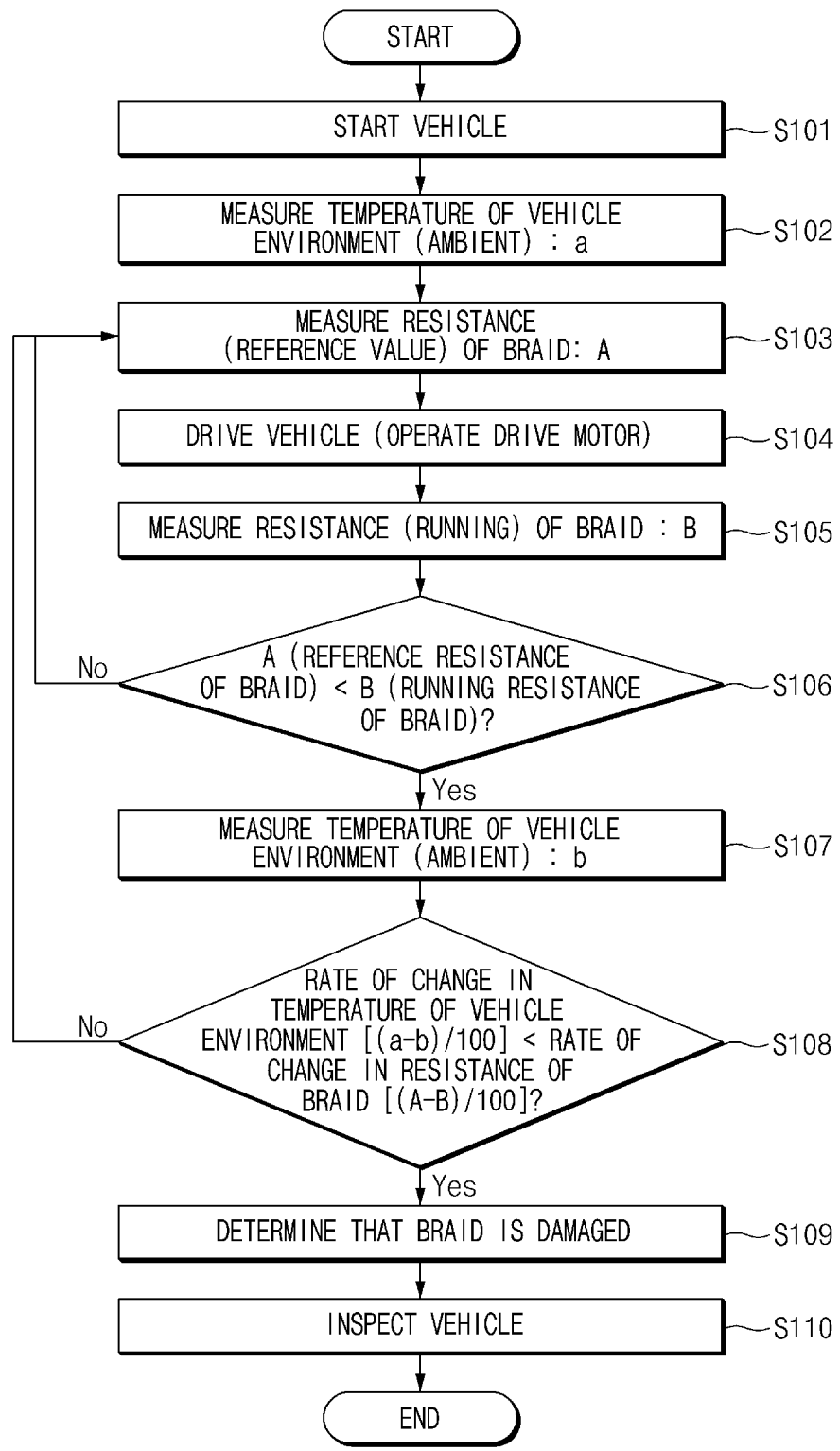
FIG. 3 is a flowchart describing a power cable failure prediction method according to an embodiment of the present disclosure.

FIG. 3 is a flowchart describing a power cable failure prediction method according to an embodiment of the present disclosure.

Hereinafter, it is assumed that the power cable failure prediction apparatus of FIG. 1 performs a process of FIG. 3.

First, after the vehicle is started and before the driving is started (S101), the temperature around the vehicle may be measured to obtain a reference temperature (S102), and a resistance of the braid 350 may be measured to obtain a reference resistance value (S103).

Subsequently, when the drive motor operates and the vehicle is driving (S104), the resistance of the braid 350 may be measured to obtain the operation resistance value (S105), and when the operation resistance value is greater than the reference resistance value (S106), a temperature around the vehicle may be measured to obtain the operation temperature (S107).

Subsequently, by comparing the rate of change of temperature based on the difference between the reference temperature and the operation temperature with the rate of change of resistance based on the difference between the reference resistance value and the operation resistance value, when the rate of change of resistance is greater than the rate of change of temperature (S108), it may be determined that the braid 350 is damaged (S109).

Subsequently, an alarm regarding the damage of the braid 350 may be generated through the alarm device 170, and a message regarding the vehicle inspection may be output through the display 190 (S110).

As described above, according to the present disclosure, a safe operation of the vehicle may be ensured by determining in advance whether a power cable of a drive motor that directly drives a vehicle wheel is damaged.

On the other hand, it is also possible to program the power cable failure prediction method according to S101 to S110 according to the present disclosure and store it in a computer-readable recording medium.

According to the present disclosure, the safe operation of the vehicle may be ensured by determining in advance whether a power cable of a drive motor that directly drives a vehicle wheel is damaged.

In addition, various effects may be provided that are directly or indirectly understood through the present disclosure.

The above description is merely illustrative of the technical idea of the present disclosure, and those of ordinary skill in the art to which the present disclosure pertains will be able to make various modifications and variations without departing from the essential characteristics of the present disclosure.

The above description provides an apparatus and method for predicting a failure of a power cable capable of ensuring safe operation of a vehicle by determining in advance whether a power cable of a drive motor that directly drives a vehicle wheel is damaged.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A power cable failure prediction apparatus, comprising:
   a temperature sensor configured to measure a temperature around a vehicle;
   a resistance measurer configured to measure a resistance of a cable connected to a drive motor of the vehicle and to measure a resistamce of a braid constituting the cable;
   a controller configured to predict in advance whether the cable is damaged by comparing the temperature around the vehicle with the resistance of the cable, wherein the controller is further configured to,
      measure a rate of change in the temperature via the sensor;
      measure a rate of change in the resitance of the cable via the resitance measurer; and
      determine that the cable is damaged, in response to the rate of change in the resistance of the cable being greater than a rate of change in the temperature around the vehicle.

2. The power cable failure prediction apparatus of claim 1, wherein the controller is further configured to:
   measure the temperature around the vehicle and the resistance of the braid before the vehicle is driven;
   measure a rate of change of the temperature around the vehicle while the vehicle is being driven via the temperature sensor,
   measure a rate of change in the resistance of the cable via the resistance measurer while the vehicle is being driven; and
   determine that the braid is damaged, in response to the rate of change in the resistance of the braid being greater than a rate of change in the temperature around the vehicle.

3. The power cable failure prediction apparatus of claim 2, wherein the controller is further configured to display an alarm, in response to determining that the braid is damaged.

4. A method of predicting a failure of a power cable, the method comprising:
- measuring a temperature around a vehicle;
- measuring a resistance of the power cable, wherein the power cable is connected to a drive motor of the vehicle;
- measuring a resistance of a braid constituting the power cable;
- predicting in advance whether the power cable is damaged, wherein the predicting comprises:
  - measuring a rate of change in the temperature around the vehicle; and
  - measuring a rate of change in the resistance of the power cable,
  - wherein, when the rate of change in the resistance of the cable is greater than the rate of change in the temperature, it is determined that the power cable is damaged.

5. The method of claim 4, wherein the predicting in advance of whether the power cable is damaged by comparing the temperature around the vehicle with the resistance of the power cable comprises:
- measuring the temperature around the vehicle and the resistance of the braid before the vehicle is driven;
- measuring the temperature around the vehicle and the resistance of the braid while the vehicle is being driven; and
- determining that the braid is damaged in response to a rate of change in the resistance of the braid being greater than a rate of change in the temperature around the vehicle.

6. The method of claim 5, further comprising:
- displaying an alarm, in response to determining that the braid is damaged.

\* \* \* \* \*